(12) United States Patent
Shi et al.

(10) Patent No.: US 7,916,500 B2
(45) Date of Patent: Mar. 29, 2011

(54) SHIELD

(75) Inventors: Zheng Shi, Shenzhen (CN);
Chih-Chiang Chang, Taipei Hsien (TW); Hong-Wei Zhang, Shenzhen (CN)

(73) Assignees: Shenzhen Futaihong Precision Industry Co., Ltd., ShenZhen, Guangdong Province (CN); FIH (Hong Kong) Limited, Kowloon (HK)

( * ) Notice: Subject to any disclaimer, the term of this patent is extended or adjusted under 35 U.S.C. 154(b) by 198 days.

(21) Appl. No.: 12/353,332

(22) Filed: Jan. 14, 2009

(65) Prior Publication Data
US 2010/0053926 A1 Mar. 4, 2010

(30) Foreign Application Priority Data
Aug. 26, 2008 (CN) .......................... 2008 1 0304195

(51) Int. Cl.
*H05K 9/00* (2006.01)
(52) U.S. Cl. ........ 361/816; 361/800; 361/818; 174/350; 174/377
(58) Field of Classification Search .................. 361/800, 361/816, 818, 753, 799; 174/350, 377
See application file for complete search history.

(56) References Cited

U.S. PATENT DOCUMENTS

| | | | | |
|---|---|---|---|---|
| 5,353,201 A | * | 10/1994 | Maeda | 361/816 |
| 5,354,981 A | * | 10/1994 | Dyck | 250/214 R |
| 5,495,399 A | * | 2/1996 | Gore et al. | 361/814 |
| 6,191,950 B1 | * | 2/2001 | Cox et al. | 361/737 |
| 6,313,400 B1 | * | 11/2001 | Mosquera et al. | 174/363 |
| 6,870,091 B2 | * | 3/2005 | Seidler | 174/382 |
| 6,992,901 B1 | * | 1/2006 | Hung | 361/818 |
| 7,285,732 B2 | * | 10/2007 | Vinokor et al. | 174/382 |
| 7,345,248 B2 | * | 3/2008 | Vinokor et al. | 174/382 |
| 7,643,310 B2 | * | 1/2010 | Long | 361/816 |

* cited by examiner

*Primary Examiner* — Dameon E Levi
(74) *Attorney, Agent, or Firm* — Steven M. Reiss

(57) ABSTRACT

A shield for electronic elements of a circuit board includes a frame and a cover, the frame including a peripheral wall comprising a plurality of fixed portions thereon, wherein the fixed portion includes a protrusion and a gap, the protrusion formed on the inner side of the peripheral wall, and the cover has a plurality of folding pieces corresponding to the fixed portions, the folding pieces defines an aperture, and the cover is mounted on the frame, the folding pieces match with the fixed portions correspondingly, the protrusion passes the aperture and locks with the aperture. When the cover is detached, the folding pieces are resisted via the gap to make the protrusion to break away from the aperture of the folding piece, enabling the cover to be opened.

8 Claims, 5 Drawing Sheets

SHIELD

BACKGROUND

1. Field of the Invention

The exemplary invention relates to electromagnetic shielding, and particularly to a shield for portable electronic devices.

2. Description of Related Art

Many electronic components in electronic device, such as capacitors, are surrounded by a shield protecting the electronic components from external electromagnetic waves and unwanted electromagnetic waves from the system. Generally, a typical shield is made by punching a metal piece. The shield is soldered to a circuit board of the electronic device to shield the electronic components.

However, such a shield is inconvenient when repairing the electronic components protected thereby, since access is, obviously, restricted. When an electronic component needs to be repaired, the shield must be dismounted completely. In the process, the shield may be damaged and become unusable.

Therefore, there is room for improvement within the art.

BRIEF DESCRIPTION OF THE DRAWINGS

Many aspects of the disclosed shield can be better understood with reference to the following drawings. These drawings are not necessarily drawn to scale, the emphasis instead being placed upon clearly illustrating the principles of the exemplary shield. Moreover, in the drawings like reference numerals designate corresponding parts throughout the several views. Wherever possible, the same reference numbers are used throughout the drawings to refer to the same or like elements of an embodiment.

DETAILED DESCRIPTION OF THE EMBODIMENTS

The disclosed shield is suitable for electronic devices, such as mobile phones, PDAs (personal digital assistants), and the like. Other applications with a similar use for the shield employed are equally applicable.

Figure 1:
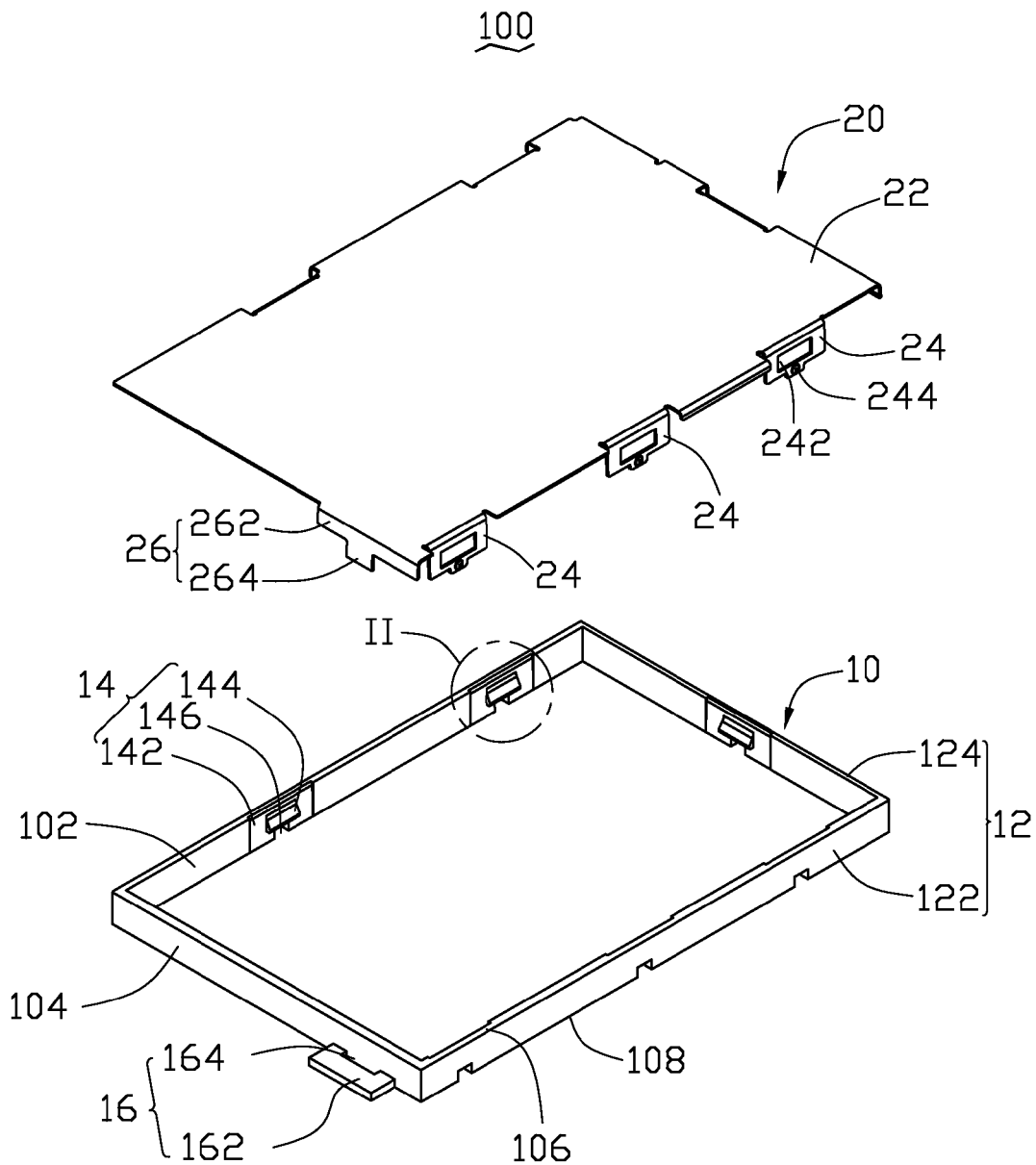
FIG. 1 is an exploded view of a shield according to an exemplary embodiment.
Figure 2:
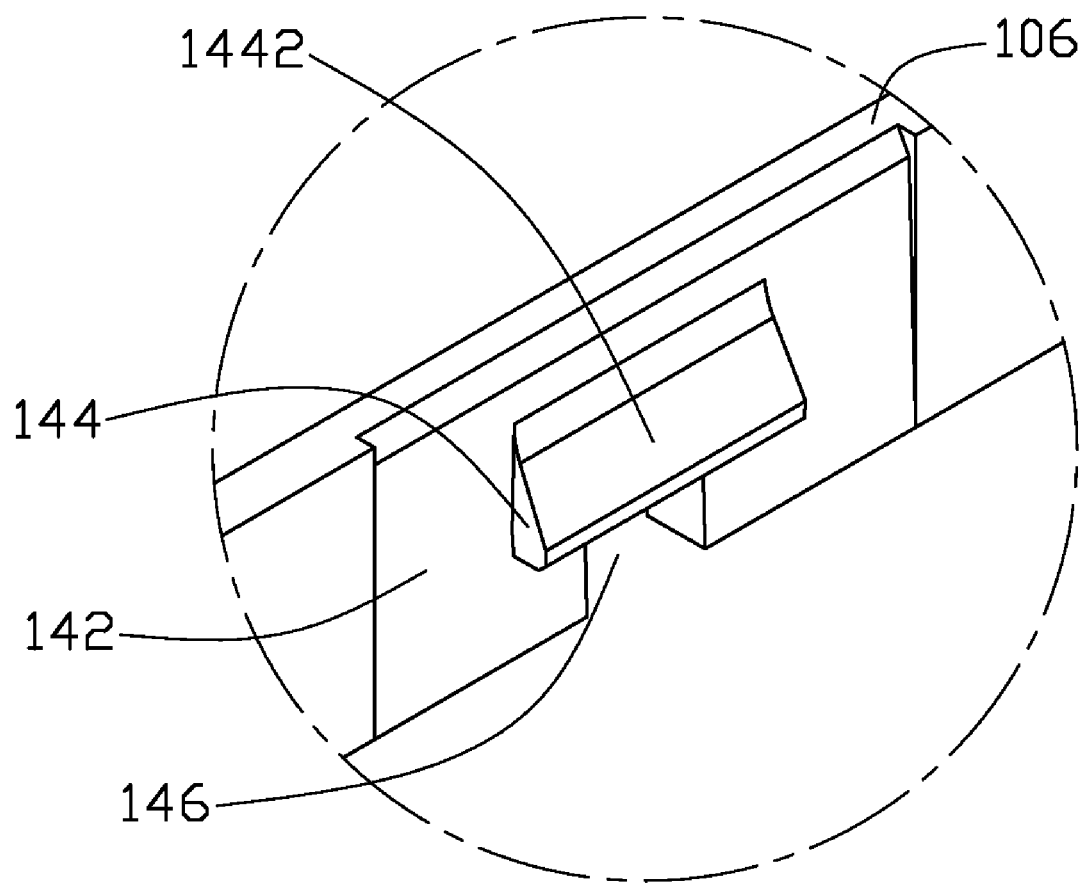
FIG. 2 is a magnified partial view of the shield in FIG. 1.

Referring to FIGS. 1 and 2, a shield 100 according to an exemplary embodiment includes a frame 10 and a cover 20 covering the frame 10.

The frame 10 includes a peripheral wall 12, a plurality of fixed portions 14 separately formed on the peripheral wall 12 and a locking portion 16 formed on the peripheral wall 12. The peripheral wall 12 includes two opposite and parallel side walls 122 and two opposite and parallel end walls 124. Each side wall 122 is perpendicularly connected to each end wall 124 to form the frame 10. The frame 10 has an inner side surface 102, an outer side surface 104, a top surface 106 and a bottom surface 108. One side wall 122 has two fixed portions 14 formed on the inner side surface 102, the other side wall 122 has three fixed portions 14 formed on the inner side surface 102. The locking portion 16 is formed on the outer side surface 104 of one end wall 124.

Each fixed portion 14 includes a recess 142, a protrusion 144 and a gap 146. The recess 142 is defined in the inner side surface 102, and the two ends of the recess overlap the top surface 106 and the bottom surface 108. The protrusion 144, formed on the bottom of the recess 142, is wedge-shaped with thickness thereof decreasing gradually from an end near the bottom surface 108 to another end near the top surface 106. The protrusion 144 includes an angled surface 1442 gradient relative to the inner side surface 102. The gap 146 is defined in the bottom surface 108 and adjacent to the protrusion 144. The gap 146 communicates the inner side surface 102 with the outer surface 104.

The locking portion 16 includes a block 162 and a locking hole 164 defined in the block 162. The block 162 extends from the outer side surface 104 of an end wall 124 and is perpendicular thereto. The locking hole 164 is positioned adjacent to the outer side surface 104.

The cover 20 includes a plane 22 corresponding to the frame 10, a plurality of folding pieces 24 perpendicularly protruding from the edge of the plane 22, and a fastening unit 26 perpendicularly protruding from the edge of the plane 22. The plane 22 is rectangular. Each of the folding pieces 24 matches a fixed portion 14 of frame 10 accordingly. Folding piece 24 is the same width as recess 142, and defines an aperture 242 receiving the protrusion 144 of the frame 10. The folding piece 24 also partially protrudes to form a protuberance 244 near the aperture 242. The protuberance 244 can extend towards the gap 146 and lock therein.

The fastening unit 26 corresponding to the locking portion 16 of the frame 10 latches with the locking portion 16. The fastening unit 26 includes a connector board 262 and a tab 264 extending from the connector board 262. The tab 264 passes the locking hole 164 and latches with the locking hole 164.

Figure 3:
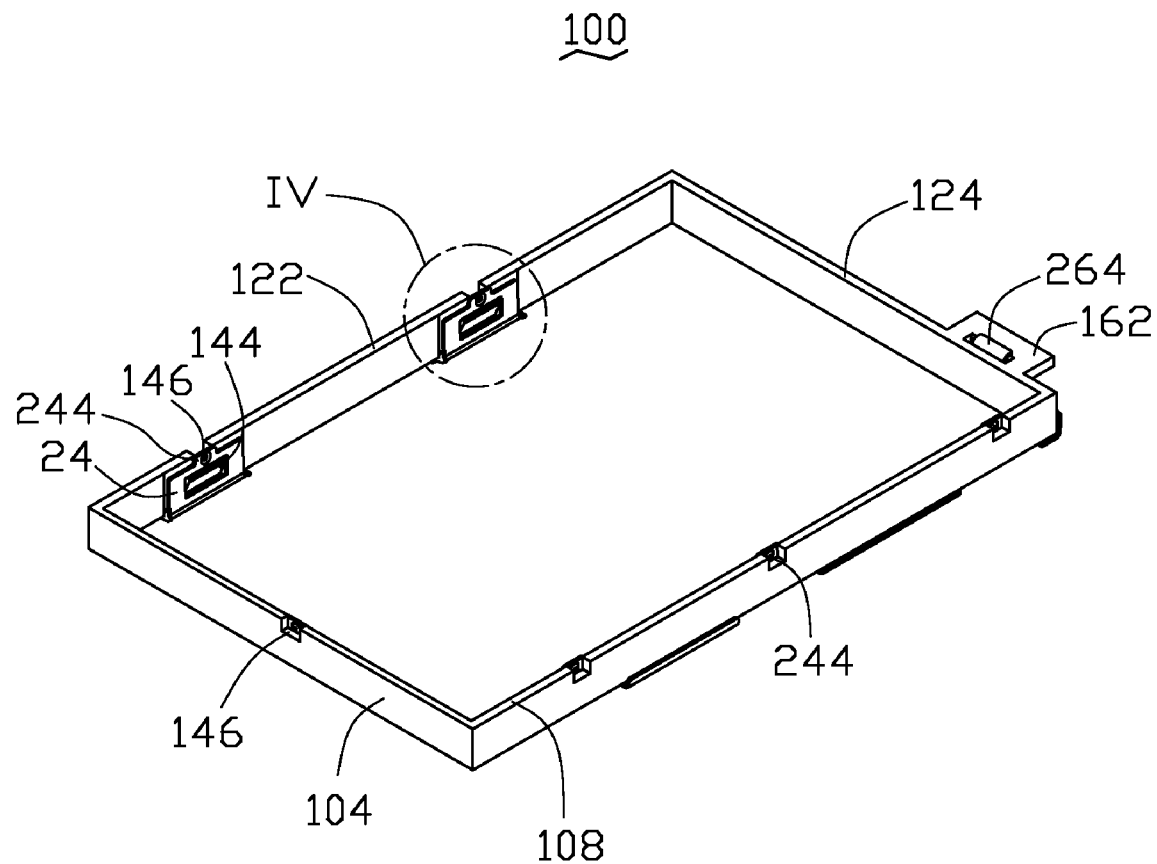
FIG. 3 is an assembled view of the shield in FIG. 1.
Figure 4:
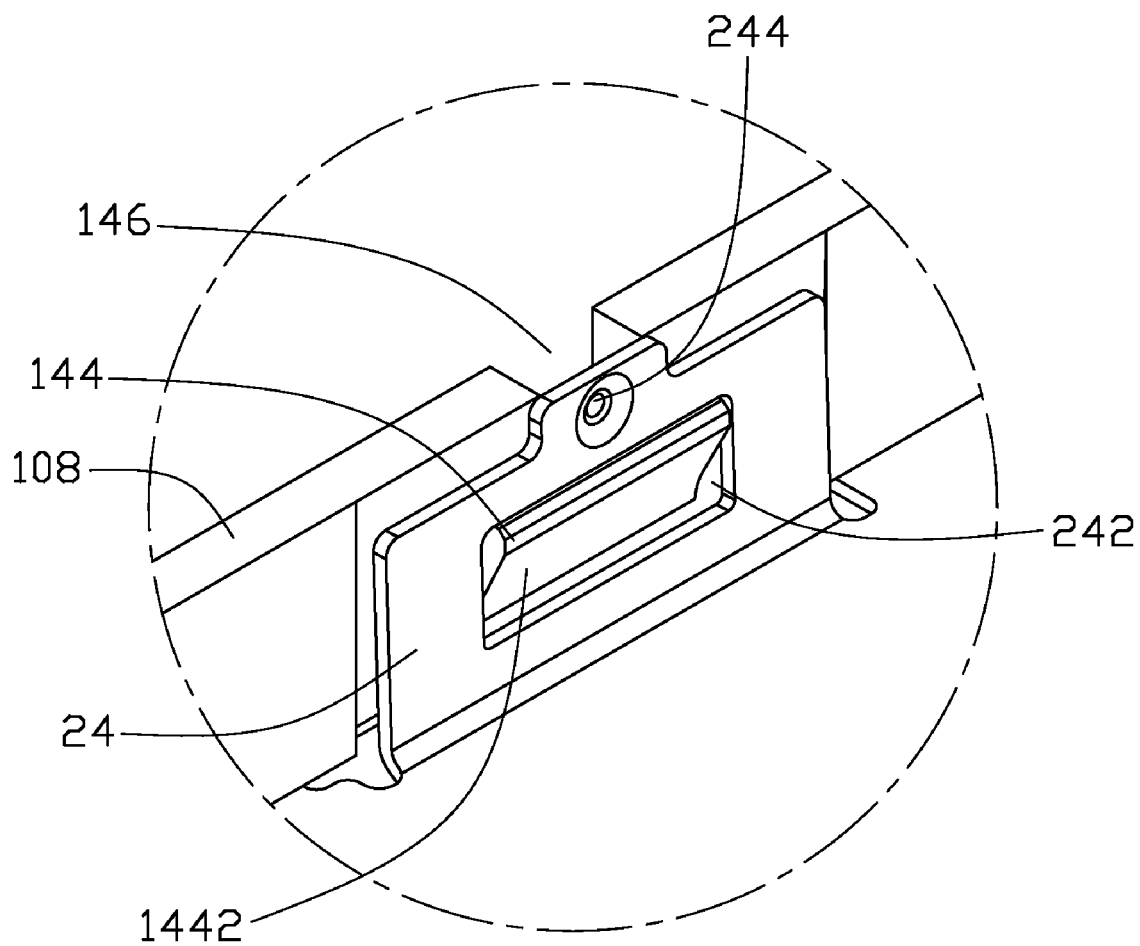
FIG. 4 is a magnified partial assembled view of the shield in FIG. 1.

Referring to FIGS. 3 and 4, during assembly of the shield 100, the cover 20 is mounted on the frame 10. The folding piece 24 is received in the recess 142, and slid along the angled surface 1442 until the aperture 242 receives the protrusion 144 of the frame 10 therein. At the same time, the protuberance 244 inserts the gap 146 and latches with the gap 146. In the process, the tab 264 of the fastening unit 26 passes the locking hole 164, the connector board 262 resists the block 162, then folds the tab 264, firmly latching the cover 20 with the frame 10.

Figure 5:
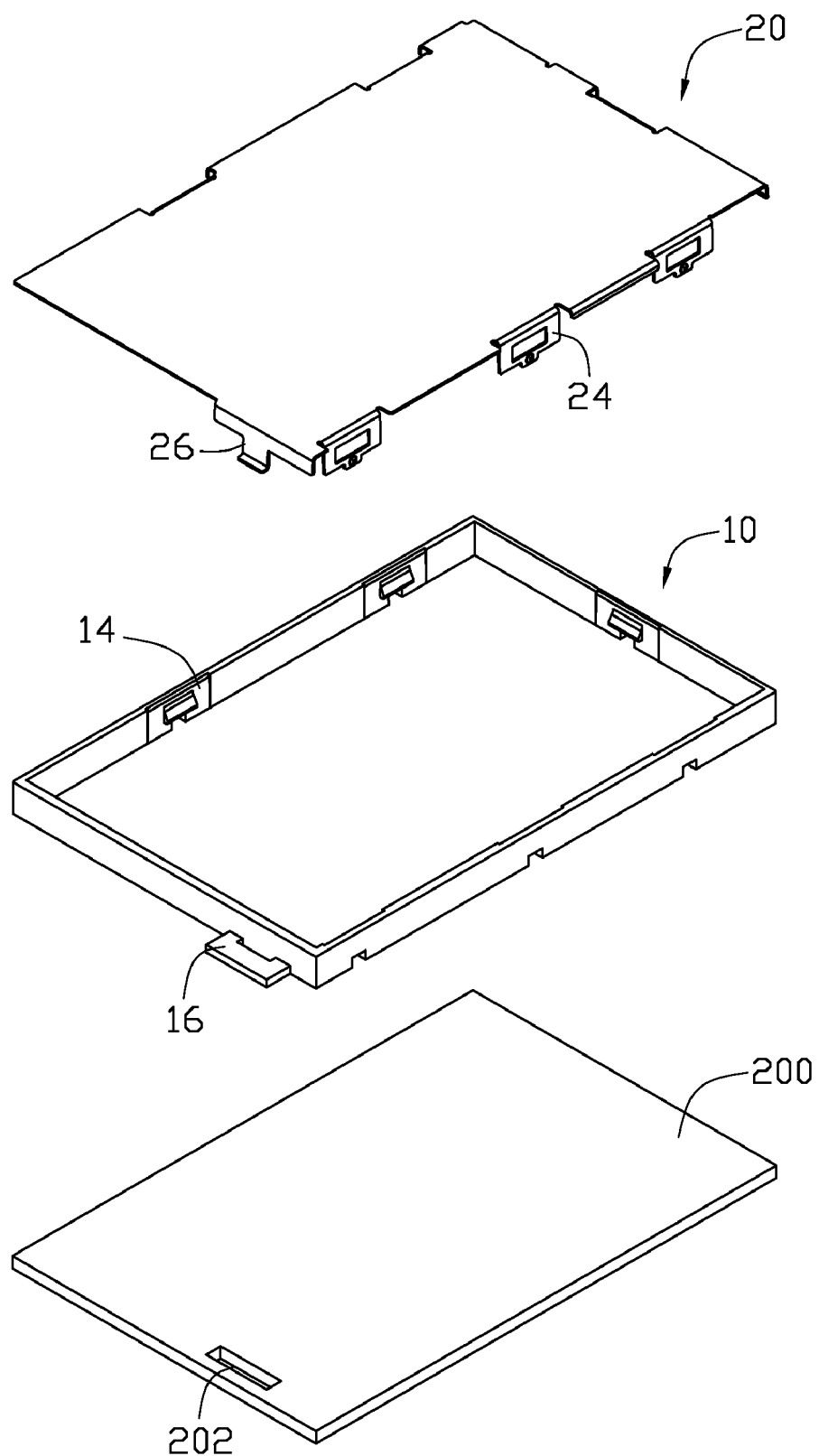
FIG. 5 is an exploded view of the shield in FIG. 1 with a circuit board.

Referring to FIG. 5, the shield 100 is mounted on a circuit board 200 which defines an orientation bore 202. The tab 264 of the shield 100 enters the orientation bore 202 such that the shield 100 is located accurately, and the bottom surface 108 of the frame 10 and the circuit board 200 are integrated. Thus the shield 100 is assembled completely.

When repairing the electronic elements in the shield 100, a tool (not shown) passes the gap 146 of the frame 10 to press the protuberance 244 of the folding piece 24, moving folding piece 24 away from the protrusion 144. Cover 20 is opened relative to the frame 10 by pivoting about the locking portion 16, allowing convenient repair of shielded elements. After repairing the electronic elements, the cover 20 is rotated and the folding pieces 24 match with the fixed portion 14 to re-situate the shield 100.

Understandably, in use, the shield 100 can be detached and attached conveniently and used many times, minimizing repair costs.

It is to be understood, however, that even though numerous characteristics and advantages of the present embodiments have been set forth in the foregoing description, together with details of the structures and functions of the embodiments, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A shield for electronic elements of a circuit board, comprising:
   a frame including a peripheral wall, the peripheral wall comprising a plurality of fixed portions thereon, each of the fixed portions comprising a protrusion and a gap, the protrusion being formed on the inner side surface of the peripheral wall; and the gap defined in the bottom surface of the peripheral wall and defined through the inner side surface and the opposite outer side surface of the peripheral wall, the protrusion located between the gap and the top surface of the peripheral wall;
   a cover including a plurality of folding pieces corresponding to the fixed portions, the folding piece defining an aperture therein and forming a protuberance adjacent to the aperture;
   wherein the cover is mounted on the frame, the folding pieces match the fixed portions correspondingly, the protrusion passes and locks with the aperture, the protuberance latching in the gap; and when the cover is detached, the protuberances of the folding pieces are resisted via the gaps to withdraw the protrusions from the apertures of the folding pieces.

2. The shield as claimed in claim 1, wherein the cover includes a plane from the edge of which the folding pieces protrude.

3. The shield as claimed in claim 1, wherein the fixed portion includes a recess, and the recess is defined in the inner side surface, and the protrusion is formed on the bottom of the recess.

4. The shield as claimed in claim 2, wherein the frame forms a locking portion thereon, the cover forms a fastening unit corresponding to the locking portion thereon, and the locking portion locks with the fastening unit.

5. The shield as claimed in claim 4, wherein the locking portion is formed on the outer side surface.

6. The shield as claimed in claim 4, wherein the fastening unit protrudes from the edge of the plane.

7. The shield as claimed in claim 4, wherein the locking portion defines a locking hole therein, and the fastening unit includes a tab, receivable in the locking hole.

8. The shield as claimed in claim 1, wherein the protrusion is wedge-shaped with the thickness thereof decreasing gradually from an end adjacent to the bottom surface to another end adjacent to the top surface.

\* \* \* \* \*